United States Patent
Gvozdenovic (10) Patent No.: US 11,392,160 B2
(45) Date of Patent: Jul. 19, 2022

(54) BIAS CIRCUIT AND BIAS SYSTEM USING SUCH CIRCUIT

(71) Applicant: Semiconductor Ideas to the Market (ITOM) B.V., Eindhoven (NL)

(72) Inventor: Aleksandar Gvozdenovic, Tilburg (NL)

(73) Assignee: Semiconductor Ideas to Market (ITOM) B.V., Eindhoven (NL)

(*) Notice: Subject to any disclaimer, the term of this patent is extended or adjusted under 35 U.S.C. 154(b) by 0 days.

(21) Appl. No.: 17/144,415

(22) Filed: Jan. 8, 2021

(65) Prior Publication Data

US 2021/0208620 A1    Jul. 8, 2021

(30) Foreign Application Priority Data

Jan. 8, 2020   (NL) .................................. N2024625

(51) Int. Cl.
| | |
|---|---|
| *G05F 3/26* | (2006.01) |
| *G05F 1/46* | (2006.01) |
| *G05F 1/575* | (2006.01) |
| *H03F 1/30* | (2006.01) |

(52) U.S. Cl.
CPC .............. *G05F 3/267* (2013.01); *G05F 1/461* (2013.01); *G05F 1/575* (2013.01); *H03F 1/301* (2013.01)

(58) Field of Classification Search
CPC .......... G05F 1/461; G05F 3/262; G05F 3/267; G05F 1/575; H03F 1/301
See application file for complete search history.

(56) References Cited

U.S. PATENT DOCUMENTS

| | | | | | |
|---|---|---|---|---|---|
| 5,519,309 | A | * | 5/1996 | Smith | ..................... G05F 1/561 327/103 |
| 5,694,033 | A | * | 12/1997 | Wei | ......................... G05F 3/262 323/315 |
| 9,195,252 | B1 | * | 11/2015 | Tanase | ....................... G05F 3/02 |
| 9,722,555 | B1 | * | 8/2017 | Nagulapalli | ........ H03F 3/45183 |
| 10,338,614 | B1 | * | 7/2019 | Day | ......................... G05F 1/575 |

* cited by examiner

*Primary Examiner* — Kyle J Moody
*Assistant Examiner* — Lakaisha Jackson
(74) *Attorney, Agent, or Firm* — Robert M. McDermott, Esq.

(57) ABSTRACT

A bias circuit includes a linear core circuit CC with first and second mutually type corresponding transistors (M1; M2) and a current mirror CM with third and fourth transistors (M3; M4) of opposite type of M1 and M2. To obtain an equilibrium with a constant transconductance of the first transistor, first and second negative feedback loops (L1; L2) are applied, one including the linear core circuit CC, the other including the current mirror CM. In a first setting one loop suppresses differences between first and second drain voltages (Vd1; Vd2) and the other loop suppresses differences between one of of the first and second drain voltage Vd1 and Vd2 and a reference voltage Vref. In the second setting, one loop suppresses differences between the first drain voltage Vd1 and the reference voltage Vref and the other loop differences between the second drain voltage Vd2 and the reference voltage Vref.

10 Claims, 7 Drawing Sheets

BIAS CIRCUIT AND BIAS SYSTEM USING SUCH CIRCUIT

This application claims the benefit of The Netherlands Patent Application N2024625 filed 8 Jan. 2020.

BACKGROUND AND SUMMARY OF THE INVENTION

The invention relates to a constant transconductance circuit, hereafter also referred to as constant gm circuit or bias circuit, and a system using such circuit. A conventional bias circuit generates a bias voltage or current for biasing an application transistor such that the application transistor has a constant transconductance. Any operative combination of a bias circuit and one or more external application transistors is hereafter referred to as constant gm bias system.

Conventional constant gm circuits and bias systems using such circuits are on itself known, e.g. from U.S. Pat. No. 6,323,725 and are based in principle on a circuit configuration as shown in FIG. 1.

Figure 1:
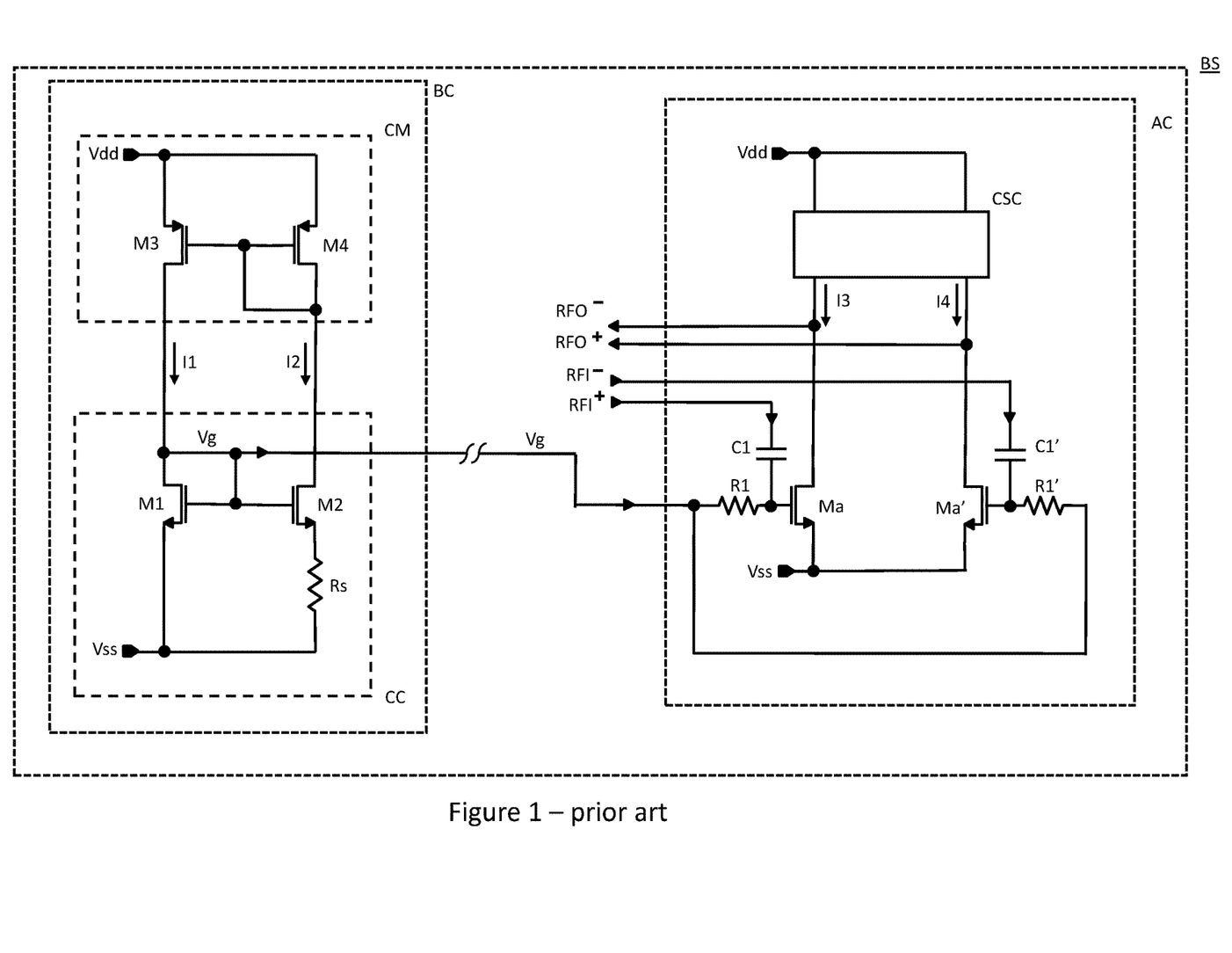
FIG. 1 illustrates a conventional constant gm bias system comprising a constant gm circuit functioning as a constant gm bias circuit and a to-be-biased application circuit.

FIG. 1 illustrates a prior art constant gm bias system comprising a constant gm bias circuit, also being referred to as bias circuit BC, operatively coupled to an application circuit AC operating as an RF amplifier. The bias circuit BC includes a linear transconductance core circuit CC with first and second mutually type corresponding transistors M1 and M2, and a current mirror CM having third and fourth transistors M3 and M4 of a type opposite to that of the first and second transistors M1 and M2. In FIG. 1, the first and second MOSFET transistors M1 and M2 are chosen to be N-channel, or N type transistors, and the third and fourth MOSFET transistors M3 and M4, P-channel, or P type. The first and fourth transistors M1 and M4 are each diode coupled, whereas the third and fourth transistors M3 and M4 are coupled in a well known current mirror arrangement, such that a current 11 flowing from a source to a drain of transistor M3 is substantially equal to a current 12 flowing from a source to a drain of transistor M4. The ratio of aspect ratios W/L of either the second transistor M2 with respect to the first transistor M1 or the third transistor M3 with respect to the fourth transistor M4, is substantially defined by m:1, in which m>1. Here, it is observed that the term "substantially" means "as close as possible to" within the error introduced by the finite output resistance of the MOSFETs, and within any possible manufacturing tolerances. This applies throughout the entire specification.

Gates of the first and second transistors M1 and M2 are connected to each other, whereas sources of said transistors M1 and M2 are connected directly, respectively through a source resistor Rs, to a reference supply voltage or ground Vss. Sources of both third and fourth transistors M3 and M4 are connected together to a power supply voltage Vdd. The drains of the first and third transistors M1 and M3, are connected to each other, by which these transistors constitute a first current branch of the constant gm bias circuit BC. Likewise, the drains the second and fourth transistors M2 and M4 are connected to each other, by which these transistors constitute a second current branch of the constant gm bias circuit BC. The gates of the first and second transistors M1 and M2 provide a DC bias voltage to the gates of a differential pair of first and second application transistors Ma and Ma' included in an application circuit AC and corresponding in type to the first transistor M1 of core circuit CC. The first and second application transistors Ma and Ma' are coupled within the application circuit AC in a well known differential RF amplifier arrangement having sources connected together with ground Vss. A differential RF input (RFI+; RFI−) of the application circuit AC is coupled through first and second RF filters (R1C1 and R1'C1−') to the gates of respectively the first and second application transistors Ma and Ma' and a differential RF output (RFO−; RFO+) of the application circuit AC is coupled to drains of said first and second application transistors Ma and Ma'. These drains are being supplied with drain bias currents received from current source circuit CSC coupled to the power supply voltage Vdd.

Figure 2:
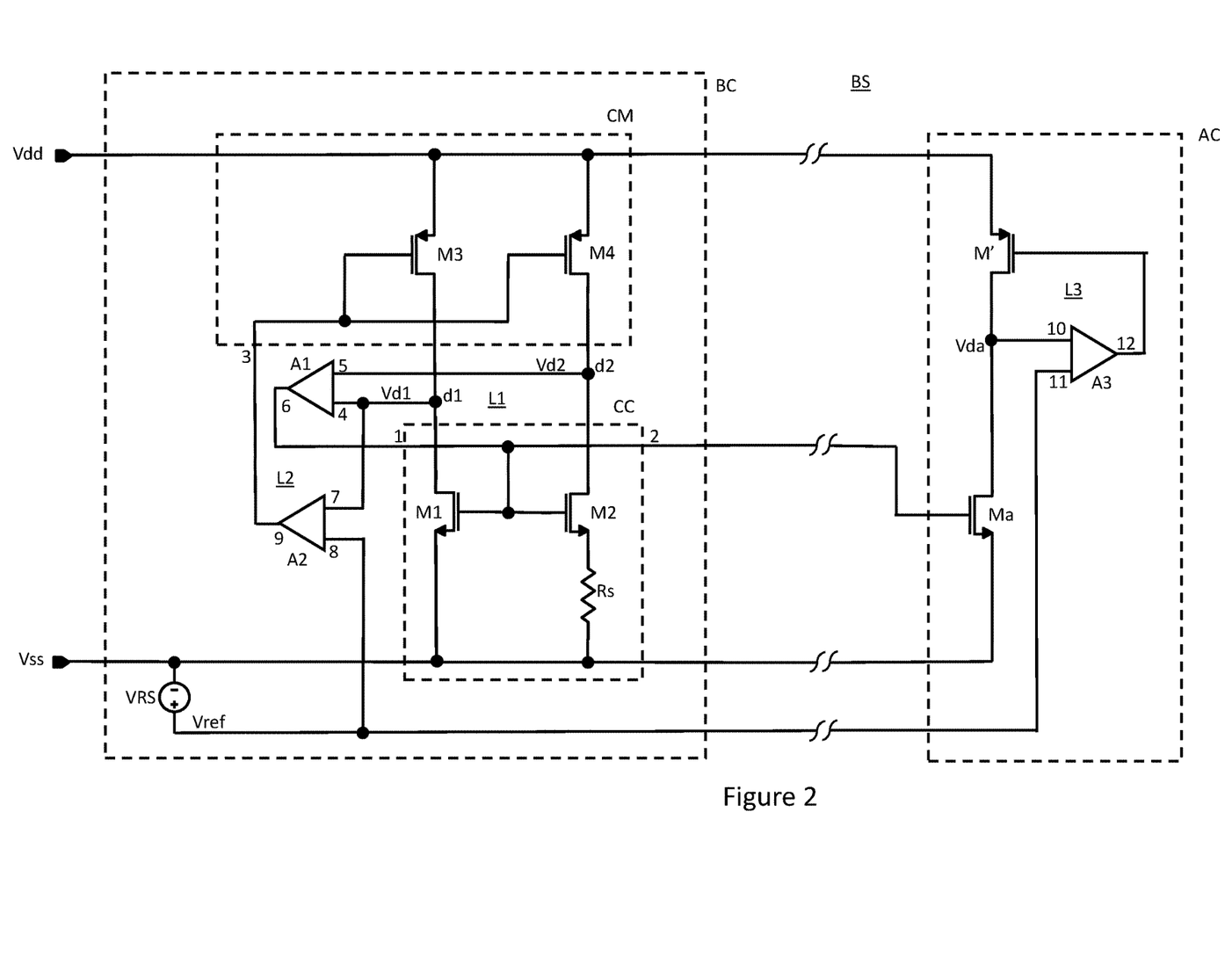
FIG. 2 illustrates a constant gm bias system circuit configured in accordance with a first exemplary embodiment of the invention wherein the biasing of a constant gm bias circuit is identically replicated to an application circuit using the DC bias voltage generated within a constant gm bias circuit and a reference voltage Vref being supplied to both the constant gm bias circuit and the application circuit.

The elements of the constant gm bias circuit BC that determine a stable transconductance are the first and second transistors (M1; M2) with the source resistor Rs of the core circuit CC together with the third and fourth transistors (M3; M4) of the current mirror CM. The core circuit CC is linear in the sense that it provides a linear voltage to current transfer function. In the absence of drain source effect and a current equilibrium where the currents through the first and second current branches are non-zero and mutually identical (enforced through the third and fourth transistors M3 and M4 of the current mirror CM) the following transconductance is obtained for M1: $gm_{M1}=2/R_{Rs}(1-1/\sqrt{m})$, hereafter referred to as formula 1, in which $R_{Rs}$ is the resistance of the source resistor Rs in [Ω]. Alternative prior art solutions avoid the use of a physical source resistor Rs by using instead e.g. one or more switched capacitors, or by using a resistor network included between the gates of the first and second transistors M1 and M2 e.g. as shown in FIG. 2 of the above cited U.S. Pat. No. 6,323,725. These alternative solutions are in general derived from the same principle expressed in the above formula 1 for $gm_{M1}$ and result in a likewise temperature stabilisation, which can only be obtained if the above assumptions are met and the transconductance of a transistor is mainly determined by its gate-source voltage.

However, in the past decade, global demand for higher speed, higher density, lower cost, and more reliable silicon IC's has led to the continuous scaling of CMOS technologies into the very deep submicron realm and along therewith to unprecedented design challenges. One of the phenomena of deep submicron CMOS technologies is that the transconductance of a transistor is not only defined by its gate-source voltage but also by its drain-source voltage. This means that prior art constant gm bias circuits based on above formula 1, or alternative formulas, such as known e.g. from US 2015/27081A1, US 2019/158031A1, Nagulapalli, R et al: "A novel current reference in 45 nm cmos technology", 2017 Second International Conference on Electrical, Computer and Communication Technologies (ICECCT), IEEE, 22 Feb. 2017, p. 1-4 and U.S. Pat. No. 6,323,725 are unsuited for implementation in deep submicron CMOS technologies.

It is a first object of the invention to provide a constant transconductance bias circuit, which can be implemented in the full range of nowdays commercially available technologies, including very deep submicron CMOS technologies securing an effective stabilisation of transconductance for PVT variations.

It is a second object of the invention introduce an extra degree of freedom in design that can be utilized to substantially improve the performance of such systems in particular on power and area efficiency, circuit complexity, and/or test and calibration time.

It is a third object of the invention in a bias system including a constant transconductance bias circuit and an application circuit to secure an identical correspondence in bias setting between the constant transconductance bias circuit and the application circuit.

Now, therefore, a constant transconductance bias circuit comprising a linear transconductance core circuit having first and second mutually type corresponding transistors and a current mirror having third and fourth transistors of a type opposite to that of the first and second transistors, sources of said first and second transistors, respectively of said third and fourth transistors being coupled to a first respectively a second supply voltage, a drain of said first transistor being coupled to a drain of said third transistor, a drain of said second transistor being coupled to a drain of said fourth transistor, respective first and second drain terminals being coupled to the drains of the first and third transistors respectively the drains of the second and fourth transistors in accordance with the invention is characterized by said first and second transistors being included in one of first and second negative feedback loop and therein having gates coupled in common an output of a first differential amplifier, said third and fourth transistors being included in the other of first and second negative feedback loops and therein having gates coupled in common an output of a second differential amplifier, both loops operating in one of first and second loop settings, in which first setting, first and second inputs of the first differential amplifier are respectively coupled to said first and second drain terminals and first and second inputs of the second differential amplifier are respectively coupled to a reference input being supplied with a reference voltage (Vref) and one of said first and second drain terminals and in which second setting, the first and second inputs of the first differential amplifier are respectively coupled to one of said first and second drain terminals and the reference input and the first and second inputs of the second differential amplifier are respectively coupled to the reference input and the other of said first and second drain terminals.

The invention is based on the recognition that in particular in deep submicron technologies, the drain voltage level in prior art constant gm bias circuits, at which the above unique equilibrium occurs is neither controllable nor exactly known. This impairs the generation of a high accuracy transconductance, which can be solved by an accurate and stable drain bias definition.

By applying the invention the unique equilibrium, where a non-zero current through each branch is identical at which a transconductance for the first transistor is obtained in accordance with formula 1, can now be controlled via the first and second loops supplying a reference voltage Vref to the reference input. The first and second loops secure a tight coupling between the reference voltage and the first and second drain voltages, which (i) eliminates drain-source voltage variations from occurring and therewith from affecting the transconductance of the first transistor, (ii) introduces in Vref an extra degree of freedom in design and (iii) allows to identically replicate the complete bias setting (drain and gate biasing) of the first transistor—being the constant gm transistor—to one or more application transistors.

On itself U.S. Pat. No. 5,694,033 A1 shows a current reference circuit including a current mirror with first and second transistors and a non-linear transistor stage with third and four transistors having sources coupled to diodes, using first and second feedback loops to allow the current reference circuit to operate at a very low voltage and have a very low sensitivity to changes in the supply voltage. The non-linearity of the transistor stage however, removes the possibility for this known current reference circuit to be used as a constant gm bias circuit. Furthermore, U.S. Pat. No. 5,694,033 A1 is published many years before the emergence of deep submicron technologies and related design issues, differing therefore widely from the invention in terms of purpose as well as field of application.

In a preferred embodiment the first and second loops are being applied in accordance with the invention to a conventional asymmetrical bias circuit, wherein the source of the second transistor is coupled to a source resistor and the ratio of the second transistor with respect to the first transistor and/or the third transistor with respect to the fourth transistor in terms of aspect ratios W/L amounts to m:1 in which m>1.

Preferably, the last mentioned embodiment comprises a DC correction circuit being included between at least one of the first and second drain terminals on the one hand and one of the first and second negative feedbackloops on the other hand and being arranged to compensate for DC bias differences due to the DC voltage across the source resistor occurring between the transistors of at least one of the pair of first and second transistors within the core circuit and the pair of third and fourth transistors within the current mirror.

A preferred embodiment of said DC correction circuit includes a drain resistor having a resistance value ratio with respect to the source resistor substantially corresponding to the ratio of aspect ratios W/L between the third and the fourth transistors, coupled between the drain of the first transistor and the first drain terminal.

In an alternative preferred embodiment of said DC correction circuit in which the drain of the second transistor is coupled through a substractor to the first negative feedback loop, a DC correction input of said subtractor being coupled to the source of the second transistor, and being configured to subtract the DC voltage across the source resistor from the drain voltage of the second transistor.

Such embodiment of the DC correction circuit preferably includes a drain resistor having a resistance value ratio with respect to the source resistor substantially corresponding to the ratio of aspect ratios W/L between the third and the fourth transistor, coupled between the first drain terminal and the drain of the third transistor.

Another preferred embodiment of a bias circuit according to the invention in which said bias circuit operates as RF amplifier comprises an RF input coupled through an RF filter to the gate input of at least one of the first and second transistors for a selective amplification of an RF input signal within a frequency range exceeding the bandpass frequency of the first and second negative feedback loops and an RF output being coupled to the drain of said at least one of the first and second transistors.

A bias system comprising a bias circuit and an application circuit according to the invention preferably comprises an application transistor included in the application circuit, which corresponds in type and drain bias to one of the first and second transistors, an RF input of said application circuit being coupled through an RF filter to a gate of said application transistor for a selective amplification of an RF input signal, a drain of said application transistor providing an RF output of said application circuit, the gate of said application transistor being coupled to the gate of said one of the first and second transistors.

In a further preferred embodiment of such bias system, the application circuit includes a third negative feedback loop comprising said application transistor, followed by a differential amplifier and a current mirror coupled to the drain of said application transistor, the differential amplifier being configured to provide differences between the voltage of the drain of the application transistor and said reference voltage being negatively fed back through the current source to the drain of the application transistor for a suppression of those differences at the drain of the application transistor.

In another preferred embodiment of the bias system using a DC correction circuit, said application circuit comprises a third differential amplifier, having a first input terminal receiving said reference voltage Vref, an output thereof being negatively fed back to a second input terminal for a negative feedback suppression of differences between the voltages at the first and second input terminals deviating from said reference voltage, said output being coupled through a drain resistor to the drain of the application transistor, said drain constituting an RF out of the application circuit, the drain resistor being dimensioned with respect to the drain resistor to generate equal voltage differences across both resistors. In this embodiment equal biasing of the first and second transistors and equal biasing of the third and fourth transistors is obtained without the need for a subtractor.

The above and other object features and advantages of the present invention will be discussed in more detail hereinafter with reference to the disclosure of preferred embodiments, in which like or similar components are designated by the same reference characters through the several views and in particular with reference to the appended Figures.

Well known circuits have been shown therein in functional schematic diagram form in order not to obscure the present invention in unnecessary detail. Details concerning current to voltage conversions allowing to use differential amplifiers to equalise drain currents by equalizing drain voltages and process considerations and the like, have been omitted inasmuch as such details are not necessary to obtain a complete understanding of the present invention and are within the skill of persons of ordinary skill in the relevant art.

DETAILED DESCRIPTION

FIG. 2 shows a bias system comprising a bias circuit BC and an application circuit AC. The bias circuit BC includes a core circuit CC having first and second NMOS type transistors M1 and M2, sources of the first transistor M1 being coupled directly, respectively through a source resistor Rs to a first supply voltage Vss, and a current mirror CM having an output stage including third and fourth PMOS type transistors M3 and M4 being controlled by an input stage, sources thereof being coupled to a second supply voltage Vdd. A drain of said first transistor M1 is coupled to a drain of said third transistor M3 through a common first drain terminal d1, a drain of said second transistor M2 is coupled to a drain of said fourth transistor M4 through a common second drain terminal d2. The first and second drain terminals d1 and d2 provide first and second drain voltages Vd1 and Vd2, respectively. Gates of the first and second transistors M1 and M2 are interconnected and coupled in common to a control input 1 as well as a DC bias output 2 of the core circuit CC. Gates of said third and fourth transistors M3 and M4 being interconnected and constituting a control input 3 of the current mirror CM. In correspondence with the conventional constant gm bias circuit of FIG. 1, either the second transistor M2 with respect to the first transistor M1 or the third transistor M3 with respect to the fourth transistor M4 are chosen to have a ratio of aspect ratios W/L of m:1, in which m≠1.

According to the invention the bias circuit BC also includes a voltage reference source VRS generating a reference voltage Vref and first and second negative feedback loops L1 and L2, respectively including a first differential amplifier A1, an output 6 thereof being coupled to the control input 1 of the core circuit CC and a second differential amplifier A2 an output 9 thereof being coupled to the control input 3 of the current mirror CM. A differential input 4, 5 of the first amplifier A1 is connected to the first and second drain terminals d1 and d2 to receive the first and second drain voltages Vd1 and Vd2, respectively, a differential input 7, 8 of the second amplifier A2 is connected to the first drain terminal d1 and d2 to receive the first drain voltage Vd1 and the voltage reference source VRS to receive the reference voltage Vref.

The first and second amplifiers A1 and A2 each generate an output signal representing the difference between the signals at its differential input and being supplied through their respective outputs 6 and 9 to the control inputs 1 and 3 of the core circuit CC and the current mirror CM, respectively. An increasing output signal at the outputs of the respective first and second amplifiers A1 and A2 causes the bias settings of the core circuit CC and the current mirror CM to change such that the difference between the first and second drain voltage Vd1 and Vd2 decreases and vice versa. Consequently, differences between the first and second drain voltages Vd1 and Vd2 are being suppressed in the first feedback loop L1 by a negative feedback of said differences through the core circuit CC to the first and second drain terminals d1 and d2, resulting in both first and second drain voltages Vd1 and Vd2 being dynamically stabilised at mutually equal values, i.e. at Vd1=Vd2. Differences between the first drain voltage Vd1 and the reference voltage Vref are being surpressed in the second feedback loop L2 by a negative feedback of said differences through the current mirro CM to the first drain terminal d1, resulting in both first drain voltage Vd1 and the reference voltage Vref being dynamically stabilised at mutually equal values, i.e. at Vd1=Vref.

The concerted operations of both first and second loops L1 and L2 dynamically stabilise both first and second drain voltages Vd1 and Vd2 at Vref, i.e. at Vd1=Vref and Vd2=Vref.

By substituting the first and second loops L1 and L2 for the gate drain connection of the diode connected constant gm transistor M1 in the prior art FIG. 1, an extra degree of freedom is introduced in the form of the reference voltage Vref in that this reference voltage Vref can be used to control the DC level of both first and second drain voltages Vd1 and Vd2, while maintaining mutual equality between these voltages.

For a proper understanding of the invention it suffices to know that by maintaining mutual equality between the first and second drain voltage Vd1 and Vd2 of the bias circuit BC of FIG. 2, the above unique state of current equilibrium is obtained, at which formula 1 applies, defining the transconductance or gm, obtained within the first transistor M1. For further details about alternative operations and configurations of conventional bias circuits, which can be improved by the invention, e.g. bias circuits without using a source resistor, reference is made to the above cited U.S. Pat. No. 6,323,725.

In the embodiment shown in FIG. 2, the constant transconductance bias setting of the constant gm transistor M1 is identically replicated to an application transistor Ma which corresponds in type with the first transistor M1 and is included in an application AC. This is obtained (i) by connecting the respective gate and source of the first transistor M1 to the gate and source of the application transistor Ma therewith supplying the gate-source voltage Vgs of the first transistor M1 to the corresponding gate and source of the application transistor Ma, and (ii) by the use of a third negative feedback loop L3 surpressing differences between the drain voltage Vda of the application transistor Ma and the reference voltage Vref. To that effect, the third loop L3 includes a third differential amplifier A3 having its differential input 10, 11 connected to the drain of the application transistor Ma and the voltage reference source VRS and its output 12 connected to a gate of a transistor M'. The transistor M' corresponds in type to the third and fourth transistors M3 and M4 of the current mirror CM having a source connected to the second supply voltage Vdd and a drain connected to the drain of the application transistor Ma. This results in a dynamical adjustment of the drain voltage Vda of the application transistor Ma to the reference voltage Vref.

Figure 3:
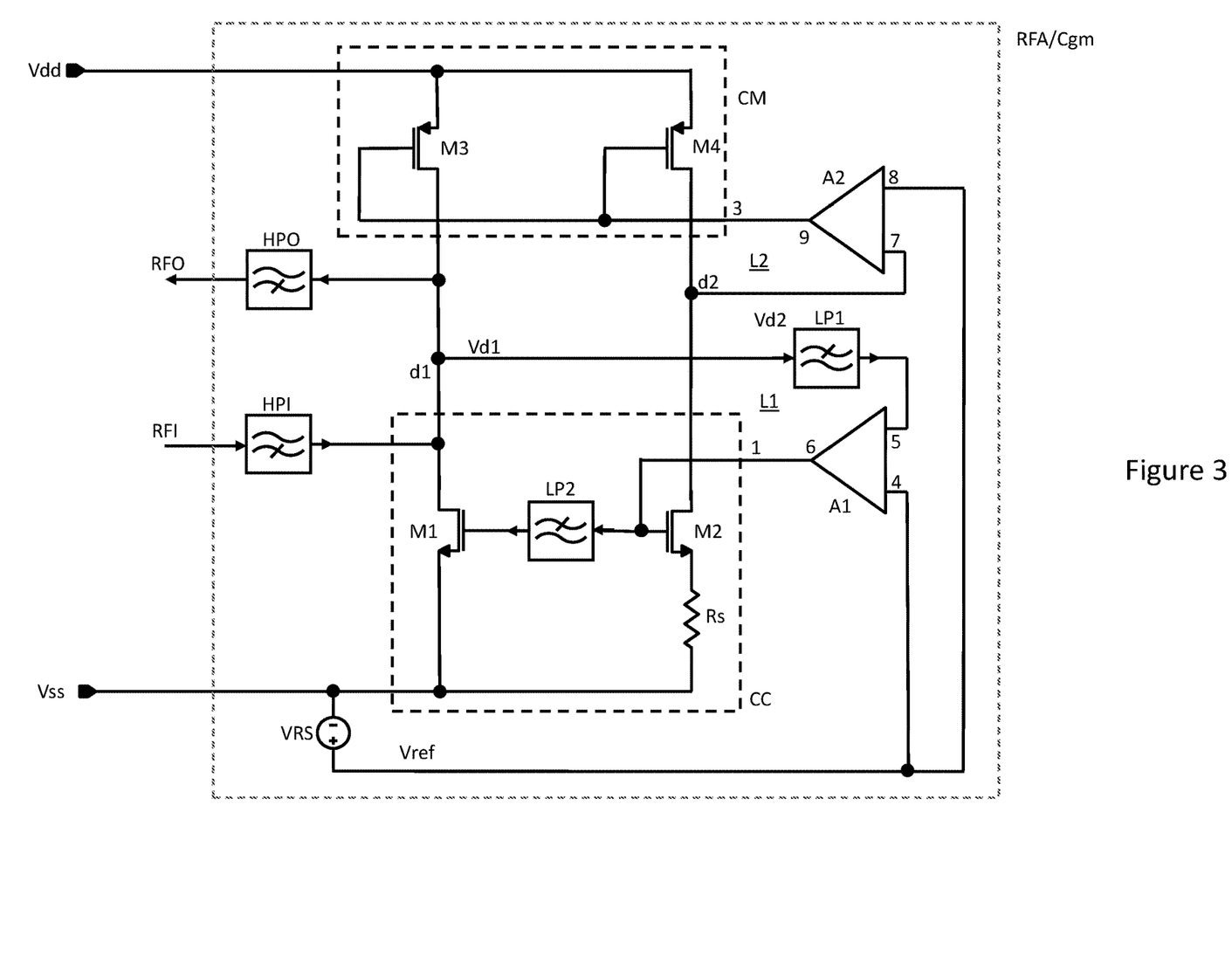
FIG. 3 illustrates a constant gm circuit transistor configured in accordance with a second exemplary embodiment of the invention wherein a constant gm circuit is used to provide a constant gain RF signal amplification.

FIG. 3 shows a stand alone constant gm circuit RFA/Cgm in which the first transistor M1 simultaneously operates in DC mode as a contant gm transistor and in RF mode as an RF amplifier. The constant gm circuit RFA/Cgm differs from the bias circuit BS of FIG. 2, in that it includes an RF input terminal RFI and an RF output terminal RFO. The RF input terminal RFI is coupled through an RF high pass input filter HPI to the first drain terminal d1 to provide an RF input signal received at the RF input terminal RFI after HP filtering to the first transistor M1 to be amplified therein. The first drain terminal d1 is coupled through an RF high pass output filter HPO to supply the amplified RF input signal after being filtered as an RF output signal to the RF output terminal RFO.

To ensure that the transconductance of the first transistor M1 is constant the first negative feedback loop L1 is configurated to surpress differences between the first drain voltage Vd1 and the reference voltage Vref, whereas the second negative feedback loop L2 is configurated to surpress differences between the second drain voltage Vd2 and the reference voltage Vref. To that effect, the differential input 4,5 of the first amplifier A1 is DC coupled the first drain terminal d1 and the reference voltage Vref, whereas the output 6 thereof is coupled through the input 1 of the core circuit CC to the gates of the first and second transistors M1 and M2. To block RF signals from entering the first negative feedback loop L1 and disturbing its DC operation, a first low pass filter LP1 Is coupled between the first drain terminal d1 and the first amplifier A1, whereas a second low pass filter LP2 Is coupled between the gate of the first transistor M1 and the output 6 of the first amplifier A1.

Figure 4A:
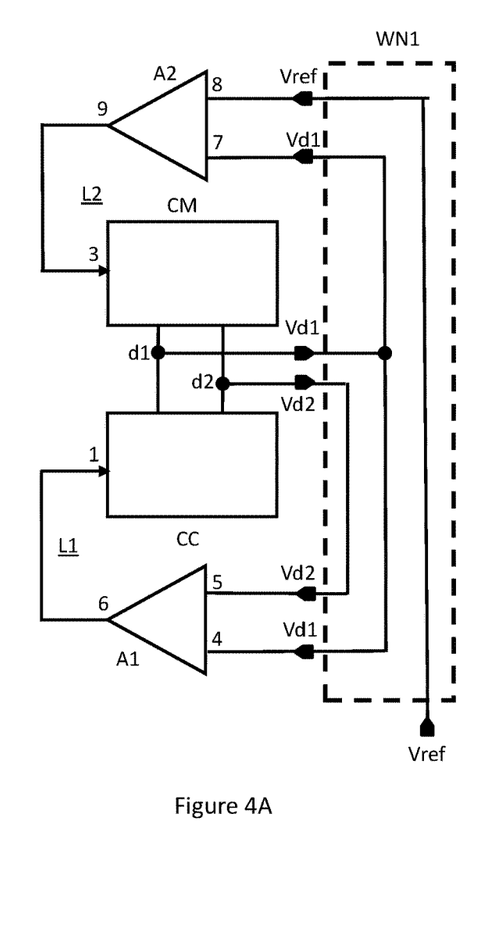
FIG. 4A to 4F illustrate the various wiring configurations which can be used for the first and second loops to calibrate both first and second drain voltages to the reference voltage Vref.

FIG. 4A shows a blockdiagram of a first mode of operation of the first and second negative feedback loops L1 and L2 in a first loop setting as used in the bias circuit BC of FIG. 2, including a first wiring network WN1 through which the first and second drain voltages Vd1 and Vd2 are being supplied to the differential input 4, 5 of the first amplifier A1 of the first loop L1 and the first drain voltage Vd1 and the voltage reference voltage Vref to the differential input 7, 8 of the second amplifier A2 of the second loop L2. As explained with reference to FIG. 2, the result thereof is that in the respective first and second loops L1 and L2 both first and second drain voltages Vd1 and Vd2 being stabilised at mutually equal values, i.e. at Vd1=Vd2, and both first drain voltage Vd1 and the reference voltage Vref are being stabilised at mutually equal values, i.e. at Vd1=Vref. The end result is that both first and second drain voltages Vd1 and Vd2 are being stabilised at Vref, i.e. at Vd1=Vd2=Vref. The same endresult is obtained by a reversed operation (not shown) of the first and second loops L1 and L2 in which the first loop L1 operates to mutually equalize Vd1 and Vref to arrive at Vd1=Vref and the second loop L2 operates to mutually equalize Vd1 and Vd2 to arrive at Vd1=Vd2.

The particular wiring lay out of the first wiring network WN1 for realizing the functionalities as indicated above may be realized by persons skilled in the art in a straightforward manner. A detailed description thereof is therefore omitted. This also applies to the wiring layout of second to sixth wiring networks WN2 to WN6 referred to in the following FIGS. 4B to 4F.

Figure 4B:
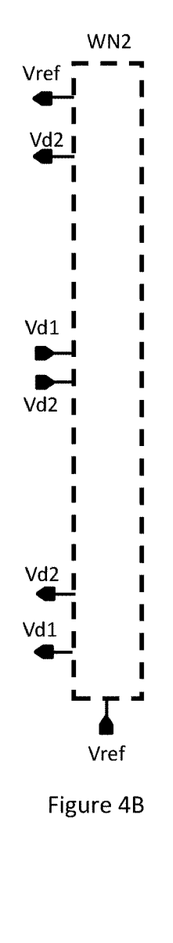

FIG. 4B shows a blockdiagram of a second mode of operation of the first and second negative feedback loops L1 and L2 in said first loop setting, including a second wiring network WN2 through which in conformity with FIG. 4A the first and second drain voltages Vd1 and Vd2 are being supplied to the differential input 4, 5 of the first amplifier A1 of the first loop L1 and different from FIG. 4A the second drain voltage Vd2 and the voltage reference voltage Vref are being supplied to the differential input 7, 8 of the second amplifier A2 of the second loop L2.

Similar to the first loop L1 of FIG. 4A, the first loop L1 operates to mutually equalize Vd1 and Vd2, resulting in Vd1=Vd2, whereas now the second loop L2 operates to mutually equalize Vd2 and Vref resulting in Vd2=Vref. The end result thereof is that also here Vd1=Vd2=Vef.

Figure 4C:
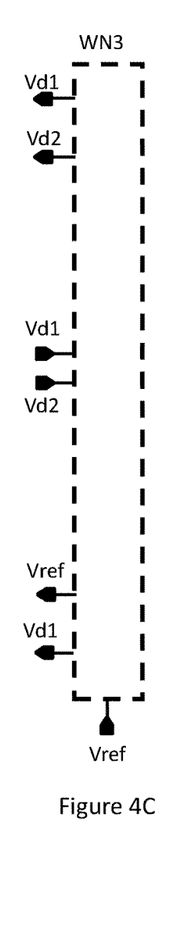

FIG. 4C shows a blockdiagram of a third mode of operation of the first and second negative feedback loops L1 and L2 in said first loop setting, including a third wiring network WN3 which is configured to supply the first drain voltage Vd1 and the reference voltage Vref to the differential input 4, 5 to the first amplifier A1 and the first and second drain voltages Vd1 and Vd2 to the differential input 7, 8 of the second amplifier A2. This third mode of operation is reversed with respect to the first mode of operation in that the first loop L1 operates to mutually equalize Vd1 and Vref to arrive at Vd1=Vref and the second loop L2 operates to mutually equalize Vd1 and Vd2 to arrive at Vd1=Vd2 with the same endresult of Vd1=Vd2=Vef as previously described.

Figure 4D:
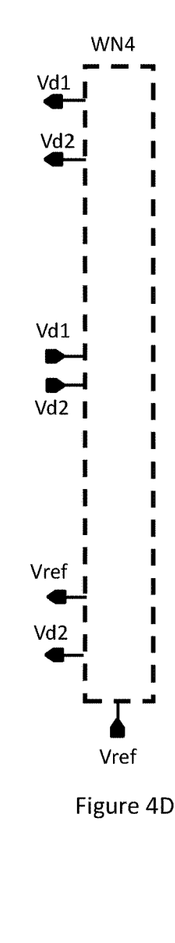

FIG. 4D shows a blockdiagram of a fourth mode of operation of the first and second negative feedback loops L1 and L2 in said first loop setting, including a fourth wiring network WN4 which is configurated to supply the second drain voltage Vd2 and the reference voltage Vref to the differential input 4, 5 to the first amplifier A1 and the first and second drain voltages Vd1 and Vd2 to the differential input 7, 8 of the second amplifier A2. This fourth mode of operation is reversed with respect to the second mode of operation in that the first loop L1 operates to mutually equalize Vd2 and Vref to arrive at Vd2=Vref and the second loop L2 operates to mutually equalize Vd1 and Vd2 to arrive at Vd1=Vd2 with the same endresult of Vd1=Vd2=Vef as previously described.

Figure 4E:
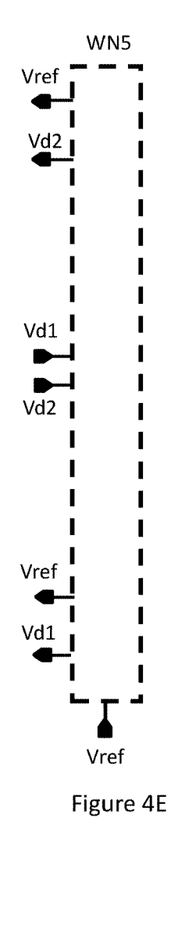

FIG. 4E shows a blockdiagram of a fifth mode of operation of the first and second negative feedback loops L1 and L2 in a second loop setting, as applied in FIG. 3. Herein a fifth wiring network WN5 is being used, which is configurated to supply the first drain voltage Vd1 and the reference voltage Vref to the differential input 4, 5 to the first amplifier A1 and the first and second differential input 7, 8 of the second amplifier A2. In this fifth mode of operation the first loop L1 operates to mutually equalize Vd1 and Vref to arrive at Vd1=Vref and the second loop L2 operates to mutually equalize Vd2 and Vref to arrive at Vd2=Vref with the same endresult of Vd1=Vd2=Vef as previously described.

Figure 4F:
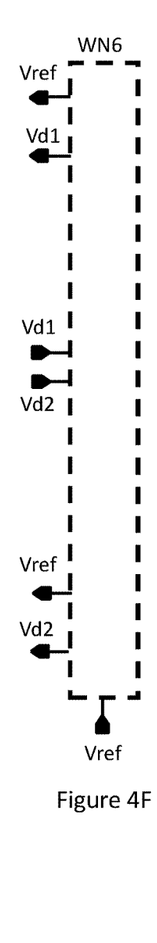
Figure 6:
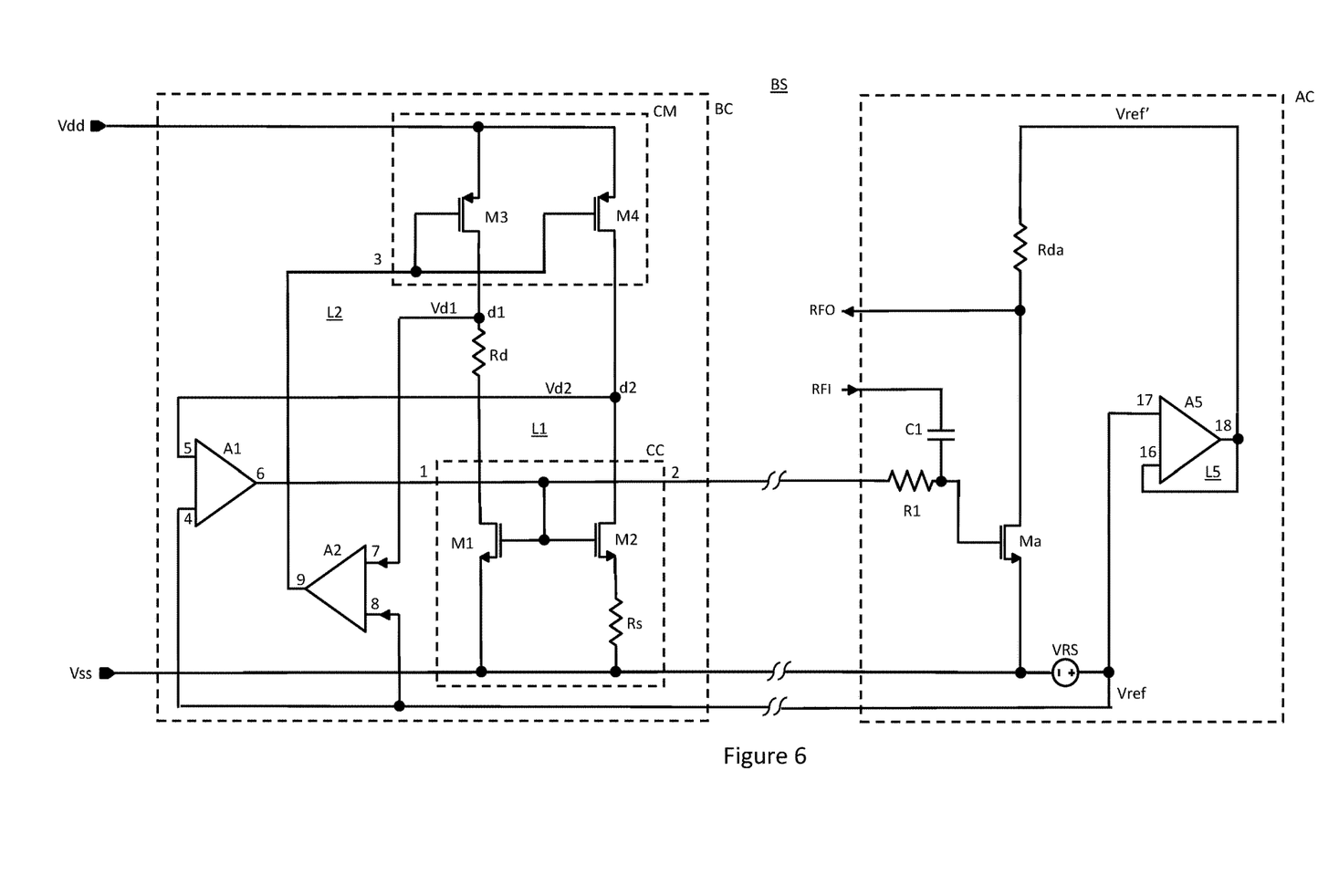
FIG. 6 illustrates a constant gm system configured in accordance with a fifth exemplary embodiment of the invention using a second configuration of a DC correction circuit for the same purpose as the constant gm system of FIG. 5.
Figure 7:
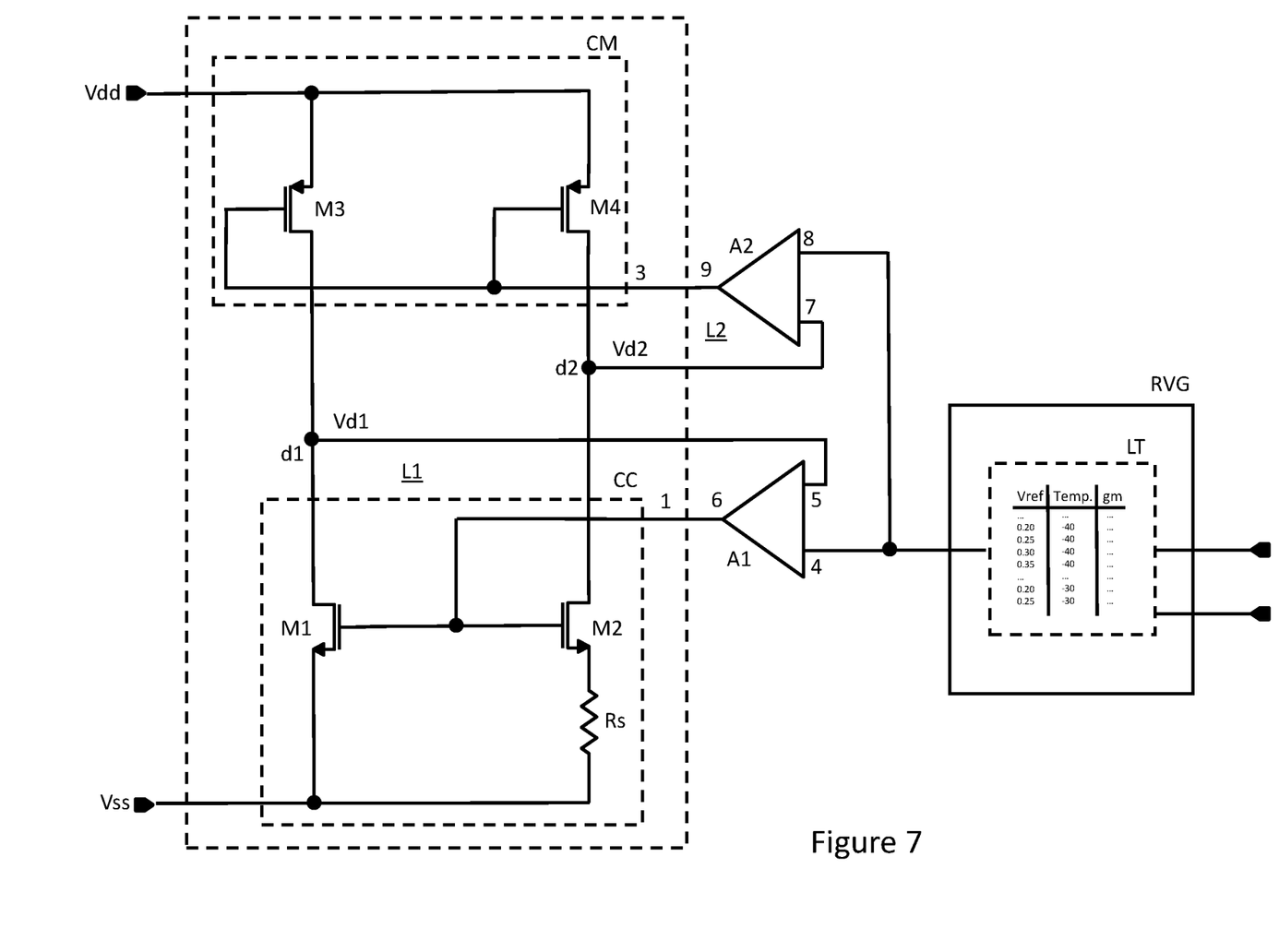
FIG. 7 illustrates a constant gm system configured in accordance with a sixth exemplary embodiment a constant gm circuit of the invention providing a controllable transconductance.

FIG. 4F shows a blockdiagram of a sixth mode of operation of the first and second negative feedback loops L1 and L2 in a second loop setting, as applied in FIGS. 6 and 7. Herein a sixth wiring network WN6 is being used, which is configurated to supply the second drain voltage Vd2 and the reference voltage Vref to the differential input 4, 5 to the first amplifier A1 and the first drain voltage Vd1 and the reference voltage Vref to the differential input 7, 8 of the second amplifier A2. This sixth mode of operation is reversed with respect to the fifth mode of operation in that the first loop L1 operates to mutually equalize Vd2 and Vref to arrive at Vd2=Vref and the second loop L2 operates to mutually equalize Vd1 and Vref to arrive at Vd1=Vref with the same endresult of Vd1=Vd2=Vef as previously described.

Summarizing FIGS. 4A to 4F, shown therein are the various modes of operations of both negative feedback loops L1 and L2 in accordance with the invention. In a first loop setting, one of the first and second loops negative feedback loops L1 and L2 is being configured to suppress differences between the first and second drain voltages Vd1 and Vd2, whereas the other is being configured to suppress differences between one of the first and second drain voltages Vd1 and Vd2 and said reference voltage Vref, or vice versa. In a second loop setting, one of the first and second loops negative feedback loops L1 and L2 is being configured to suppress differences between the first drain voltage Vd1 and said reference voltage Vref and the other is being configured to suppress differences between the second drain voltage Vd2 and said reference voltage Vref, or vice versa.

Figure 5:
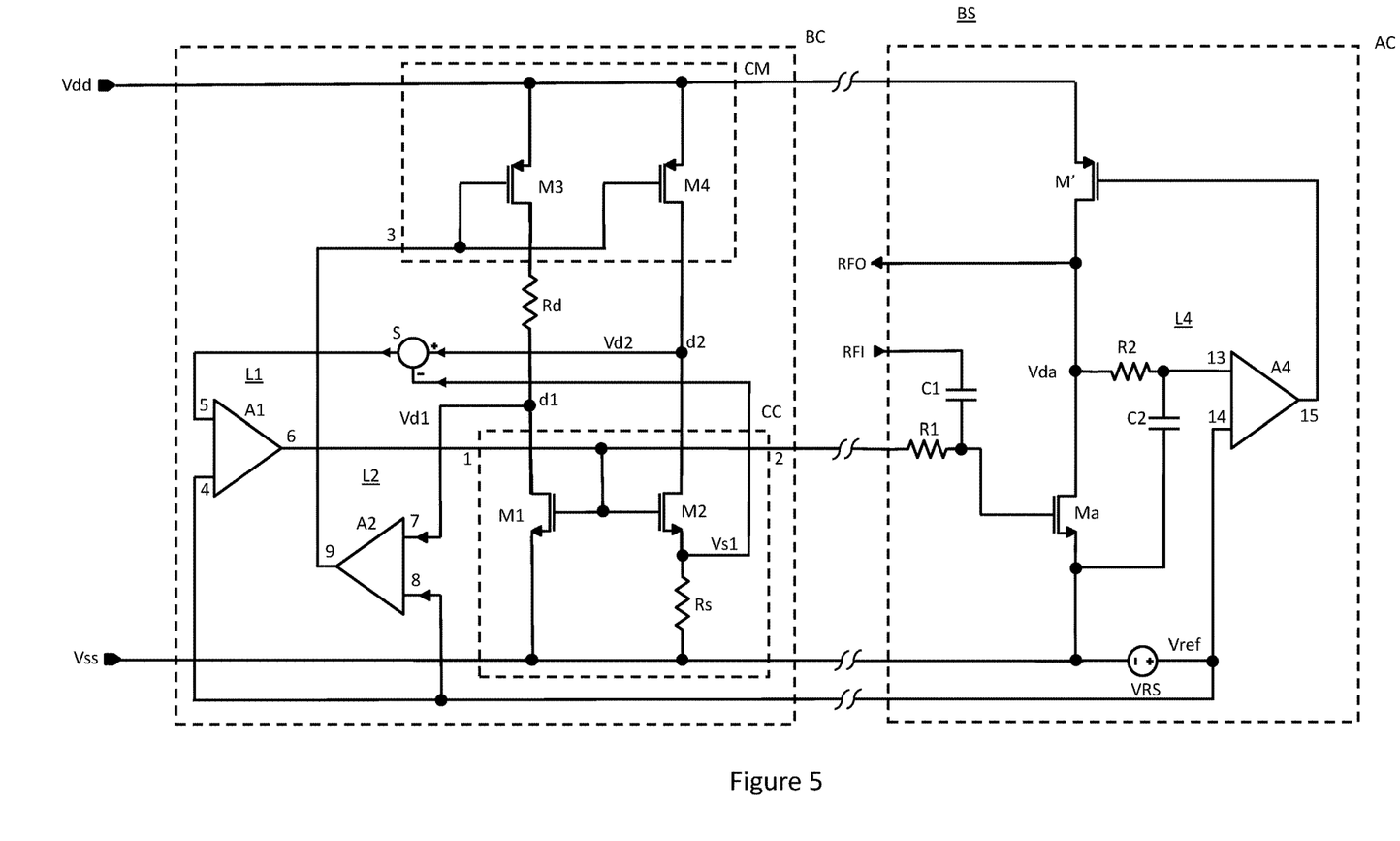
FIG. 5 illustrates a constant gm system configured in accordance with a fourth exemplary embodiment of the invention using a first configuration of a DC correction circuit to obtain mutually equal biasing between the first and second transistors of the core circuit, respectively between the third and fourth transistors of the current mirror.

FIG. 5 illustrates a constant gm bias system BS in accordance with a fourth exemplary embodiment of the invention comprising a bias circuit BC and an application circuit AC. The bias circuit BC includes a first configuration of a DC correction circuit to obtain mutually equal biasing between the first and second transistors M1 and M2 of the core circuit CC, respectively between the third and fourth transistors M3 and M4 of the current mirror CM, while maintaining a correct operation of the first and second negative feedback loops L1 and L2 in equalizing Vd1 and Vd2 to Vref.

The DC correction circuit comprises a drain resistor Rd included between the drain of the third transistor M3 and the first drain terminal d1. In order for the bias of the first transistor M1 to be equal to the bias of the second transistor M2 and the bias of the third transistor M3 to be equal to the bias of the fourth transistor M4, the drain resistor Rd is chosen to have a resistance value ratio with respect to the source resistor Rs substantially corresponding to the ratio of aspect ratios W/L between the third and the fourth transistor M3 and M4. At this resistance ratio the voltage Vs1 across the source resistor Rs is equal to that across the drain resistor Rd.

In this configuration a difference between the first and second drain voltages Vd1 and Vd2 occurs due to the voltage across the source resistor Rs of the second transistor M2. To eliminate this asymmetry from entering the first negative feedback loop L1, the DC correction circuit also includes a subtractor S receiving at a positive input thereof the second drain voltage Vd2 from the second drain terminal d2 and at a negative input thereof the source voltage of the second transistor M2 input in order to subtract said source voltage from the second drain voltage Vd2. The result thereof is supplied from the output of the subtractor S to the first differential amplifier A1 causing the first and second negative feedback loops 1 and 2 to dynamically adjust the first and second drain voltage Vd1 and Vd2 such that M1 and M2 are mutually drain-source biased to the reference voltage Vref.

The application circuit AC is provided with an RF input RFI being coupled via an RC high pass filter R1C1 to a gate of an application transistor Ma functioning as an RF amplifier. Gates, respectively sources, of the application transistor Ma and the first constant gm transistor M1 are mutually connected, whereas both transistors Ma and M1 mutually correspond in type.

A drain of the application transistor Ma is coupled to an RF output RFO of the application circuit AC to provide an RF output signal.

The application circuit AC also includes a fourth negative feedback loop L4 including a fourth differential amplifier A4 having a differential input 13, 14 receiving on the one hand the drain voltage of the application transistor Ma Vda through a low pass filter R2C2 and on the other hand the reference voltage Vref and an output 15 coupled the gate of a controllable drain transistor M'. The low pass filter R2C2 blocks the RF output signal at the drain of the application transistor Ma from entering into the fourth negative feedback loop L4.

The drain transistor M' is type opposite to the application transtor Ma, a drain thereof being commonly connected to the drain of the application transistor Ma and a source thereof being connected to the second supply voltage Vdd.

The fourth negative feedback loop L4 surpresses differences between the drain voltage Vda of the application transistor Ma and the reference voltage Vref, causing said drain voltage Vda to assume the value of Vref, i.e Vda=Vref.

This results in both gate and drain biasing of the first constant gm transistor M1 being identically replicated to the application transistor Ma effecting identical correspondence in transconductance between the accurate tracking in constant transductance between the first constant gm transistor M1 and the application transtor Ma.

FIG. 6 illustrates a constant gm bias system BS in accordance with a fifth exemplary embodiment of the invention comprising a bias circuit BC and an application circuit AC. The bias circuit BC includes a second configuration of a DC correction circuit to obtain mutually equal biasing between the first and second transistors M1 and M2 of the core circuit CC, respectively between the third and fourth transistors M3 and M4 of the current mirror CM, while maintaining a correct operation of the first and second negative feedback loops L1 and L2 in equalizing Vd1 and Vd2 to Vref without the use of the above subtractor S.

Unlike the first configuration of the DC correction circuit of FIG. 5, the drain of the first transistor M1 this second configuration is coupled subsequently through the drain resistor Rd and the first drain terminal d1 to the drain of the third transistor M3. Also here, the resistance of drain resistor Rd with respect to that of the source resistor Rs is chosen at a ratio substantially corresponding to the ratio of aspect ratios W/L between the third and the fourth transistors M3 and M4. Therewith obtaining voltages across the source resistor Rs and the drain transistor Rd that are mutually equal, i.e. $\Delta V(Rs)=\Delta V(Rd)=\Delta V$.

The first and second negative feedback loops L1 and L2 cause the first and second drain voltages Vd1 and Vd2 to be mutually equal, i.e. Vd1=Vd2, resulting in the drain voltage of the first constant gm transistor M1 to fall short with respect to the first drain voltage Vd1 by $\Delta V$.

The application circuit AC is provided with an RF input RFI being coupled via an RC high pass filter R1C1 to a gate of an application transistor Ma, which functions as an RF amplifier.

A drain of the application transistor Ma is coupled to an RF output RFO of the application circuit AC to provide an RF output signal. Gates, respectively sources, of the application transistor Ma and the first constant gm transistor M1 are mutually connected, whereas both transistors Ma and M1 mutually correspond in type. This results in the gate-source biasing of the first constant gm transistor M1 being identically replicated to the application transistor Ma.

The application circuit AC also includes a fifth negative feedback loop L5 constituted by a fifth differential amplifier A5 being negatively fed back from its output 18 to a first terminal 16 of its differential input 16, 17. A second terminal 17 of its differential input 16, 17 receives the reference voltage Vref, resulting in the fifth differential amplifier A5 generating an output voltage Vref' which equals the reference voltage Vref. An output 18 of the fifth differential amplifier A5 is coupled through a drain resistor Ra to the drain of the application transistor Ma.

By chosing the resistance of the drain resistor Ra to correspond to the resistance of the drain resistor Rd in the bias circuit BC also the drain-source biasing of the first constant gm transistor M1 is being identically replicated to the application transistor Ma.

FIG. 7 illustrates the constant gm circuit of FIG. 3 in DC mode Cgm being supplied with reference voltage Vref generated in a reference voltage generator RVG. The reference voltage generator RVG comprises a look up table LT including a complete dataset characterizing the constant gm circuit Cgm and built up comprehensively by measuring the transconductance (gm) of the constant gm circuit Ggm as function of temperature (Temp) and reference voltage Vref without a priori knowledge. Receiving as input the temperature information as well as a wanted transconductance value, a related reference voltage Vref can be looked up and generated in the reference voltage generator RVG, which when being supplied to the constant gm circuit Cgm sets transconductance (gm) of the first transistor M1 at the wanted value.

A person skilled in the art will understand that the functions of the first and second current branches for obtaining a constant transconductance and/or DC correction as described above can be mutually reversed and other features, components, elements, etc. explicitly used to explain the invention can be substituted by technical equivalents unless otherwise stated.

While the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded by the present invention be defined by reading into any claim a limitation found herein that does not explicitly appear in the claim itself.

The invention claimed is:

1. A constant transconductance bias circuit comprising a linear core circuit having first and second mutually type corresponding transistors (M1; M2), and a current mirror (CM) having third and fourth transistors (M3; M4) of a type opposite to that of the first and second transistors (M1; M2), said first and second transistors (M1; M2) being coupled to a first supply voltage and said third and fourth transistors (M3; M4) being coupled to a second supply voltage, drains of said first and third transistors (M1; M3) being coupled in common to a first drain terminal (d1) providing a first drain voltage (Vd1) and drains of said second and fourth transistors (M2; M4) being coupled to a second drain terminal (d2) providing a second drain voltage (Vd2), characterized by said first and second transistors (M1; M2) being included in one of first and second negative feedback loop (L1; L2) and therein having gates coupled in common an output of a first differential amplifier, said third and fourth transistors (M3; M4) being included in the other of first and second negative feedback loops (L1; L2) and therein having gates coupled in common an output of a second differential amplifier, both loops (L1; L2) operating in one of first and second loop settings, in which first setting, first and second inputs of the first differential amplifier are respectively coupled to said first and second drain terminals (d1; d2) and first and second inputs of the second differential amplifier are respectively coupled to a reference input being supplied by a reference voltage (Vref) and one of said first and second drain terminals (d1; d2) and in which second setting, the first and second inputs of the first differential amplifier are respectively coupled to one of said first and second drain terminals (d1; d2) and the reference input and the first and second inputs of the second differential amplifier are respectively coupled to the reference input and the other of said first and second drain terminals (d1; d2).

2. The constant transconductance bias circuit according to claim 1, characterized by a ratio of aspect ratios W/L of m:1 of one of the second transistor (M2) with respect to the first transistor (M1) and the third transistor (M3) with respect to the fourth transistor (M4), in which m>1 and by a source resistor Rs coupled between the source of the second transistor (M2) and the first supply voltage (Vss).

3. The constant transconductance bias circuit according to claim 2, characterized by a DC correction circuit being included between at least one of the first and second drain terminal (d1; d2) on the one hand and one of the first and second negative feedbackloop (L1; L2) on the other hand and being arranged to compensate for DC bias differences due to the DC voltage across source resistor (Rs) occurring between the transistors of at least one of the pair of first and second transistors (M1; M2) within the core circuit (CC) and the pair of third and fourth transistors (M3; M4) within the current mirror (CM).

4. The constant transconductance bias circuit according to claim 3, characterized in that the DC correction circuit includes a drain resistor (Rd) having a resistance value ratio with respect to the source resistor Rs substantially corresponding to the ratio of aspect ratios W/L between the third and the fourth transistor (M3: M4), coupled between the drain of the first transistor (M1) and the first drain terminal (d1).

5. The constant transconductance bias circuit according to claim 3, characterized in that the drain of the second transistor (M2) is coupled through a substractor (S) to the first negative feedbackloop (L1), a DC correction input of said subtractor (S) being coupled to the source of the second transistor (M2), and being configured to subtract the DC voltage across the source resistor (Rs) from the drain voltage of the second transistor (M2).

6. The constant transconductance bias circuit according to claim 5, characterized in that the DC correction circuit includes a drain resistor (Rd) having a resistance value ratio with respect to the source resistor (Rs) substantially corresponding to the ratio of aspect ratios W/L between the third and the fourth transistor (M3; M4), coupled between the first drain terminal (d1) and the drain of the third transistor (M3).

7. The constant transconductance bias circuit according to claim 1, characterized by an RF input coupled through an RF filter to the gate input of at least one of the first and second transistors (M1; M2) for a selective amplification of an RF input signal within a frequency range exceeding the bandpass frequency of the first and second negative feedback loops and an RF output being coupled to the drain of said at least one of the first and second transistors (M1; M2).

8. The constant transconductance bias system comprising a bias circuit according to claim 1, characterized by an application circuit (AC) including an application transistor (Ma) corresponding in type and drain bias to one of the first and second transistors (M1; M2), an RF input of said application circuit (AC) being coupled through an RF filter to a gate of said application transistor (Ma) for a selective amplification of an RF input signal, a drain of said application transistor (Ma) providing an RF output of said application circuit (AC), the gate of said application transistor (Ma) being coupled to the gate of said one of the first and second transistors (M1; M2).

9. The constant transconductance bias system according to claim 8, characterized in that said application circuit includes a third negative feedback loop (L3) comprising said application transistor (Ma), followed by a third differential amplifier (A3) and a current source (M') coupled to the drain of said application transistor (Ma), the differential amplifier (A3) being configured to provide differences between the drain voltage of the application transistor (Ma) and said reference voltage (Vref), being negatively fed back through the current source (M') to the drain of the application transistor (Ma) for a suppression of those differences at the drain of the application transistor (Ma).

10. The constant transconductance bias circuit according to claim 1, characterized in that said reference voltage (Vref) is generated by a reference voltage generator (RVG) comprising a look up table including datasets of numerical values of temperature, transconductance and reference voltage Vref reflecting the variation in transconductance of the bias circuit as function of temperature and reference voltage Vref, said bias circuit receiving a temperature (Temp) and a transconductance (gm) control input signal being supplied to the look up table to read out the reference voltage (Vref) related to said temperature and transconductance control input signal, which reference voltage Vref is being supplied to the first and second negative feedback loops (L1;L2) to set the transconductantance of the first transistor (M1) at the transconductance control input signal.

\* \* \* \* \*